United States Patent
Erchak et al.

(10) Patent No.: US 7,391,059 B2
(45) Date of Patent: Jun. 24, 2008

(54) ISOTROPIC COLLIMATION DEVICES AND RELATED METHODS

(75) Inventors: Alexei A. Erchak, Cambridge, MA (US); Elefterios Lidorikis, Ioannina (GR); Michael Lim, Cambridge, MA (US); Nikolay I. Nemchuk, North Andover, MA (US); Jo A. Venezia, Sunnyvale, CA (US)

(73) Assignee: Luminus Devices, Inc., Billerica, MA (US)

( * ) Notice: Subject to any disclaimer, the term of this patent is extended or adjusted under 35 U.S.C. 154(b) by 0 days.

(21) Appl. No.: 11/370,395

(22) Filed: Mar. 7, 2006

(65) Prior Publication Data
US 2007/0085084 A1    Apr. 19, 2007

Related U.S. Application Data

(60) Provisional application No. 60/737,136, filed on Nov. 16, 2005, provisional application No. 60/727,753, filed on Oct. 17, 2005.

(51) Int. Cl.
*H01L 33/00* (2006.01)
(52) U.S. Cl. .................. 257/98; 257/E33.068; 977/950
(58) Field of Classification Search .......... 257/E33.067, 257/E33.071, E33.074; 438/27, 32; 977/949, 977/950, 951, 952
See application file for complete search history.

(56) References Cited

U.S. PATENT DOCUMENTS

| | | | |
|---|---|---|---|
| 3,739,217 A | 6/1973 | Bergh | |
| 4,570,172 A | 2/1986 | Henry et al. | |
| 5,073,041 A | 12/1991 | Rastani | |
| 5,132,751 A | 7/1992 | Shibata et al. | |
| 5,162,878 A | 11/1992 | Sasagawa et al. | |
| 5,181,220 A | 1/1993 | Yagi | |
| 5,426,657 A | 6/1995 | Vakhsoori | |
| 5,600,483 A | 2/1997 | Fan et al. | |
| 5,631,190 A | 5/1997 | Negley | |
| 5,779,924 A | 7/1998 | Krames et al. | |
| 5,793,062 A | 8/1998 | Kish et al. | |
| 5,955,749 A | 9/1999 | Joannopoulos et al. | |
| 6,091,085 A | 7/2000 | Lester | |

(Continued)

FOREIGN PATENT DOCUMENTS

WO    WO 02/41406    5/2002

OTHER PUBLICATIONS

Boroditsky, M., et al., "Light extraction from optically pumped light-emitting diode by thin-slab photonic crystals," *Appl. Phys. Lett.*, vol. 75., No. 8, pp. 1036-1038 (1999).

(Continued)

*Primary Examiner*—Carl Whitehead, Jr.
*Assistant Examiner*—Jennifer M Dolan
(74) *Attorney, Agent, or Firm*—Wolf, Greenfield & Sacks, P.C.

(57) ABSTRACT

Devices, such as light-emitting devices (e.g., LEDs), and methods associated with such devices are provided. A light-emitting device may include an interface through which emitted light passes therethrough. The interface having a dielectric function that varies spatially according to a pattern, wherein the pattern is arranged to provide light emission that has a substantially isotropic emission pattern and is more collimated than a Lambertian distribution of light.

19 Claims, 18 Drawing Sheets

(a)

(b)

(c)

U.S. PATENT DOCUMENTS

| | | |
|---|---|---|
| 6,380,551 B2 | 4/2002 | Abe et al. |
| 6,410,348 B1 | 6/2002 | Chen |
| 6,410,942 B1 | 6/2002 | Thibeault et al. |
| 6,426,515 B2 | 7/2002 | Ishikawa |
| 6,469,324 B1 | 10/2002 | Wang |
| 6,504,180 B1 | 1/2003 | Heremans et al. |
| 6,522,063 B2 | 2/2003 | Chen |
| 6,534,798 B1 | 3/2003 | Scherer et al. |
| 6,574,383 B1 | 6/2003 | Erchak et al. |
| 6,657,236 B1 | 12/2003 | Thibeault |
| 6,661,028 B2 | 12/2003 | Chen |
| 6,711,200 B1 | 3/2004 | Scherer et al. |
| 6,777,871 B2 | 8/2004 | Duggal et al. |
| 6,784,027 B2 | 8/2004 | Streubel et al. |
| 6,784,463 B2 | 8/2004 | Camras et al. |
| 6,791,117 B2 | 9/2004 | Yoshitake |
| 6,791,119 B2 | 9/2004 | Slater, Jr. et al. |
| 6,803,603 B1 | 10/2004 | Nitta et al. |
| 6,831,302 B2 | 12/2004 | Erchak et al. |
| 6,847,057 B1 | 1/2005 | Gardner et al. |
| 6,878,969 B2 | 4/2005 | Tanaka |
| 6,891,203 B2 | 5/2005 | Kozawa |
| 6,924,163 B2 | 8/2005 | Okazaki |
| 6,956,247 B1 | 10/2005 | Stockman |
| 6,958,494 B2 | 10/2005 | Lin |
| 7,098,589 B2 | 8/2006 | Erchak et al. |
| 7,105,861 B2 | 9/2006 | Erchak et al. |
| 7,138,666 B2 | 11/2006 | Erchak et al. |
| 7,211,831 B2 | 5/2007 | Erchak et al. |
| 2002/0163947 A1 | 11/2002 | Ostergaard et al. |
| 2003/0116767 A1 | 6/2003 | Kreissl et al. |
| 2003/0141507 A1 | 7/2003 | Krames et al. |
| 2003/0179991 A1 | 9/2003 | Baba et al. |
| 2003/0222263 A1 | 12/2003 | Choi |
| 2004/0027062 A1 | 2/2004 | Shiang et al. |
| 2004/0080926 A1 | 4/2004 | Chen et al. |
| 2004/0086249 A1* | 5/2004 | Zoorob ............... 385/129 |
| 2004/0206962 A1* | 10/2004 | Erchak et al. ......... 257/79 |
| 2004/0207320 A1 | 10/2004 | Erchak |
| 2005/0001957 A1 | 1/2005 | Amimori et al. |
| 2005/0051787 A1 | 3/2005 | Erchak et al. |
| 2005/0078241 A1 | 4/2005 | Lee et al. |
| 2005/0082545 A1* | 4/2005 | Wierer et al. ......... 257/79 |
| 2005/0112886 A1 | 5/2005 | Asakawa |
| 2005/0145864 A1 | 7/2005 | Sugiyama et al. |
| 2005/0145877 A1 | 7/2005 | Erchak |
| 2005/0151125 A1 | 7/2005 | Erchak et al. |
| 2005/0167687 A1 | 8/2005 | Erchak |
| 2005/0173714 A1* | 8/2005 | Lee et al. .............. 257/84 |
| 2005/0205883 A1 | 9/2005 | Wierer |
| 2005/0211994 A1 | 9/2005 | Erchak |
| 2006/0027815 A1 | 2/2006 | Wierer |
| 2006/0204865 A1 | 9/2006 | Erchak et al. |
| 2007/0085083 A1 | 4/2007 | Erchak et al. |
| 2007/0085098 A1 | 4/2007 | Erchak et al. |
| 2007/0087459 A1 | 4/2007 | Erchak et al. |

OTHER PUBLICATIONS

Bulu, I., et al., "Highly directive radiation from sources embedded inside photonic crystals," *Appl. Phys. Lett.*, vol. 83, No. 16, pp. 3263-3265 (2003).

Cahn, et al., Quasicrystal, 2002, McGraw-Hill, www.accessscience.com.

Chen, L., et al., "Fabrication of 50-100 nm Patterned InGaN Blue Light Emitting heterostructures," *Phys. Stat. Sol.*, vol. 188, No. 1, pp. 135-138 (2001).

Erchak, A., et al., "Enhanced coupling to vertical radiation using a two-dimensional photonic crystal in a semiconductor light-emitting diode," *Appl. Phys. Lett.*, vol. 78, No. 5, pp. 563-565 (2001).

Gourley, P.L., et al., "Optical Bloch waves in a semiconductor photonic lattice," *Appl. Phys. Lett.*, vol. 60, No. 22, pp. 2714-2716 (1992).

Gourley, P.L., et al., "Optical properties of two-dimentional photonic lattices fabricated as honeycomb nanostructures in compound semi-conductors," *Appl. Phys. Lett.*, vol. 64, No. 6, pp. 687-689 (1994).

International Search Report, from PCT/US2006/040331, mailed Apr. 30, 2007.

Kaliteevski, M., et al., "Two-Dimensional Penrose-Tiled Photonic Quasicrystals: From Diffraction Pattern to Band Structure", 2000, Nanotechnology 11, pp. 274-280.

Kock, A., et al., "Novel surface emitting GaAs/GlGaAs laser diodes based on surface mode emission," *Appl. Phys. Lett.*, vol. 63, No. 9, pp. 1164-1166 (1993).

Krames, M., et al., "Introduction to the Issue on High-Efficiency Light-Emitting Diodes," *IEEE Journal*, on selected topic in quantum electronics, vol. 8, No. 2, pp. 185-188 (2002).

Lee, Y.J., et al., "A high-extraction-effiency nanopatterned organic light-emitting diode," *Appl. Phys. Lett*, vol. 82, No. 21, pp. 3779-3781 (2003).

Oder, T.N., et al., "III-nitride photonic crystals," *Appl. Phys. Lett.*, vol. 83, No. 6, pp. 1231-1233 (2003).

Office Actions/Responses from U.S. Appl. No. 11/369,895, Apr. 13, 2007.

Office Actions/Responses from U.S. Appl. No. 11/369,894, May 11, 2007.

Rattier, M., et al., "Omnidirectional and compact guided light extraction from Archimedean photonic lattices," *Appl. Phys. Lett.*, vol. 83, No. 7, pp. 1283-1285 (2003).

Schnitzer, I., et al., "30% external quantum efficiency from surface textured, thin-film light-emitting diodes," *Appl. Phys. Lett*, vol. 63, No. 18, pp. 2174-2176 (1993).

Streubel, K., et al., "High Brightness AlGaInP Light-Emitting Diodes", *IEEE Journal on selected topic in quantum electronic*, vol. 8, No. 2, pp. 321-332 (2002).

Wendt, J.R., et al., "Nanofabrication of photonic lattice structures in GaAs/AIGaAs," *J. Vac. Sci. Tech.*, vol. 11, No. 6, pp. 2637-2640 (1993).

Zelsmann, M., et al., "Seventy-fold enhancement of light extraction from a defectless photonic crystal made on silicon-on-insulator," *Appl. Phys. Lett.*, vol. 83, No. 13, pp. 2542-2544 (2003).

* cited by examiner (a)

(b)

ISOTROPIC COLLIMATION DEVICES AND RELATED METHODS

RELATED APPLICATIONS

This application claims priority under 35 U.S.C. § 119(e) to U.S. Provisional Application Ser. No. 60/727,753, filed on Oct. 17, 2005, and U.S. Provisional Application Ser. No. 60/737,136, filed on Nov. 16, 2005, which are herein incorporated by reference in their entirety.

FIELD OF INVENTION

The invention relates generally to light-emitting devices, as well as related components, systems, and methods, and more particularly to light-emitting devices having patterned interfaces.

BACKGROUND

There are a variety of light-emitting devices, such as light-emitting diodes (LEDs), laser diodes, and optical amplifiers, which can emit light and which may be used in various applications. The emitted light may be characterized by numerous metrics, including light extraction, collimation, and azimuthal isotropy. Light extraction is a measure of the amount of light emitted as compared to the amount of light generated within the light-emitting device. Collimation is a measure of the angular deviation of emitted light with respect to the normal of the emission surface of the light-emitting device. Azimuthal isotropy (or uniformity) is a measure of the uniformity of light emitted versus an azimuthal angle, hereafter sometimes referred to simply as isotropy.

Each of the above-mentioned metrics of a light-emitting device may play an important role in determining the suitability of a particular light-emitting device for different applications. In general, light extraction relates to device efficiency, since any light generated by the device which is not extracted can result in decreased efficiency. Light collimation can be of importance if an application that incorporates the light-emitting device operates more efficiently, and/or with fewer optical components, as a result of the collimated light emission. Azimuthal isotropy may be of significance in applications where isotropic light emission is desired, and where isotropic light emission may reduce or eliminate the need for additional optical components.

As such, in many applications, it can be desirable to tailor light extraction, collimation, and/or azimuthal isotropy.

SUMMARY OF INVENTION

In some embodiments, the invention provides devices, such as light-emitting devices, as well as related components, systems and methods.

In one embodiment, a light-emitting device comprises an interface through which emitted light passes therethrough. The interface having a dielectric function that varies spatially according to a pattern, and the pattern arranged to provide light emission that has a substantially isotropic emission pattern and is more collimated than a Lambertian distribution of light.

Other aspects, embodiments and features of the invention will become apparent from the following detailed description of the invention when considered in conjunction with the accompanying drawings. The accompanying figures are schematic and are not intended to be drawn to scale. In the figures, each identical, or substantially similar component that is illustrated in various figures is represented by a single numeral or notation.

For purposes of clarity, not every component is labeled in every figure. Nor is every component of each embodiment of the invention shown where illustration is not necessary to allow those of ordinary skill in the art to understand the invention. All patent applications and patents incorporated herein by reference are incorporated by reference in their entirety. In case of conflict, the present specification, including definitions, will control.

DETAILED DESCRIPTION

Certain embodiments of the invention provide light-emitting devices and methods associated with such devices. The devices may include a pattern formed on an interface through which light passes through. For example, the interface can be an emission surface of the device, or an interface between layers within the device. As described further below, the pattern can be defined by a series of features having certain characteristics (e.g., feature size, depth, nearest neighbor distances) which may be configured to influence the characteristics of the light emitted from the device including, but not limited to, light extraction, collimation, and/or isotropy.

Figure 1:
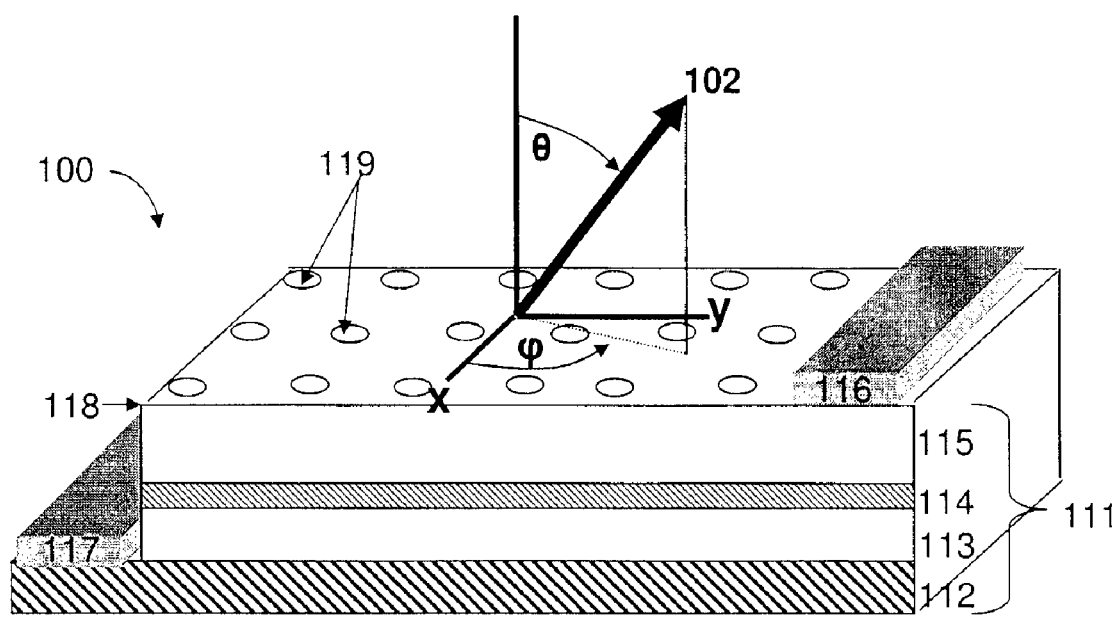
FIG. 1 is a schematic of a representative LED according to some embodiments of the invention.

FIG. 1 illustrates a representative LED 100, which is an example of a light-emitting device shown for illustrative purposes. It should be understood that various embodiments can also be applied to other devices, and are not limited to just LEDs. The LED comprises a multi-layer stack 111 that may be disposed on a sub-mount (not shown). The multi-layer stack 111 can include an active region 114 which is formed between n-doped layer(s) 115 and p-doped layer(s) 113. The stack also includes a conductive layer 112. An n-side contact pad 116 is disposed on layer 115, and a p-side contact pad 117 may be disposed on conductive layer 112. It should be appreciated that the LED is not limited to the configuration shown in FIG. 1, for example, the n-doped and p-doped sides may be interchanged so as to form a LED having a p-doped region in contact with the contact pad 116 and an n-doped region in contact with the contact pad 117. As described further below, electrical potential may be applied to the contact pads which can result in light generation within active region 114 and emission of at least some of the light generated through an emission surface 118. As described further below, openings 119 may be defined in the emission surface, and/or at any other interface, to form a pattern that can influence light emission characteristics, such as extraction, collimation, and/or isotropy.

It should be appreciated that various modifications of LED 100 are possible. For example, in one variation, electrode 117 is absent, and electrical contact to layer(s) 113 is made via conductive layer 112 through a conductive submount (not shown) which is attached to conductive layer 112. It should be understood that other various modifications can be made to the representative LED structure presented, and that the invention is not limited in this respect.

The active region of an LED can include one or more quantum wells surrounded by barrier layers. The quantum well structure may be defined by a semiconductor material layer (e.g., in a single quantum well), or more than one semiconductor material layers (e.g., in multiple quantum wells), with a smaller band gap as compared to the barrier layers. Suitable semiconductor material layers for the quantum well structures include InGaN, AlGaN, GaN and combinations of these layers (e.g., alternating InGaN/GaN layers, where a GaN layer serves as a barrier layer).

The n-doped layer(s) 115 can include a silicon-doped GaN layer (e.g., having a thickness of about 300 nm thick) and/or the p-doped layer(s) 113 include a magnesium-doped GaN layer (e.g., having a thickness of about 40 nm thick). The conductive layer 112 may be a silver layer (e.g., having a thickness of about 100 nm), which may also serve as a reflective layer (e.g., that reflects upwards any downward propagating light generated by the active region 114). Furthermore, although not shown, other layers may also be included in the LED; for example, an AlGaN layer may be disposed between the active region 114 and the p-doped layer(s) 113. It should be understood that compositions other than those described herein may also be suitable for the layers of the LED.

As a result of openings 119, emission surface 118 of the LED can have a dielectric function that varies spatially according to a pattern which can influence the extraction efficiency, collimation, and/or isotropy of light emitted by the LED. In the illustrative LED 100, the pattern is formed of openings, but it should be appreciated that the variation of the dielectric function at an interface need not necessarily result from openings.

Any suitable way of producing a variation in dielectric function according to a pattern may be used. For example, the pattern may be formed by varying the composition of layer 115 and/or emission surface 118. The pattern may be periodic (e.g., having a simple repeat cell, or having a complex repeat super-cell), periodic with de-tuning, or non-periodic. As referred to herein, a complex periodic pattern is a pattern that has more than one feature in each unit cell that repeats in a periodic fashion. Examples of complex periodic patterns include honeycomb patterns, honeycomb base patterns, (2×2) base patterns, ring patterns, and Archimidean patterns. As discussed below, in some embodiments, a complex periodic pattern can have certain openings with one diameter and other openings with a smaller diameter. As referred to herein, a non-periodic pattern is a pattern that has no translational symmetry over a unit cell that has a length that is at least 50 times the peak wavelength of light generated by active region 114. Examples of non-periodic patterns include aperiodic patterns, quasi-crystalline patterns, Robinson patterns, and Amman patterns.

In certain embodiments, an interface of a light-emitting device is patterned with openings which can form a photonic lattice. Suitable LEDs having a dielectric function that varies spatially (e.g., a photonic lattice) have been described in, for example, U.S. Pat. No. 6,831,302 B2, entitled-"Light Emitting Devices with Improved Extraction Efficiency," filed on Nov. 26, 2003, which is herein incorporated by reference in its entirety. As described further below, the pattern may conform to a transformation of a precursor pattern according to a mathematical function, including, but not limited to an angular displacement transformation. The pattern may also include a portion of a transformed pattern, including, but not limited to, a pattern that conforms to an angular displacement transformation. The pattern can also include regions having patterns that are related to each other by a rotation.

Light may be generated by LED 100 as follows. The p-side contact pad 117 (or conductive layer 112) can be held at a positive potential relative to the n-side contact pad 116, which causes electrical current to be injected into the LED. As the electrical current passes through the active region, electrons from n-doped layer(s) 115 can combine in the active region with holes from p-doped layer(s) 113, which can cause the active region to generate light. The active region can contain a multitude of point dipole radiation sources that generate light with a spectrum of wavelengths characteristic of the material from which the active region is formed. For InGaN/GaN quantum wells, the spectrum of wavelengths of light generated by the light-generating region can have a peak wavelength of about 445 nanometers (nm) and a full width at half maximum (FWHM) of about 30 nm, which is perceived by human eyes as blue light. The light emitted by the LED may be influenced by any patterned interface (e.g., the emission surface 118) through which light passes, whereby the pattern can be arranged so as to influence the collimation and/or isotropy of the emitted light.

It should be appreciated that the patterns presented herein may also be incorporated into light-collection devices, including, but not limited to, optical filters, solar cells, and photodetectors. In such devices, the patterns may be configured to influence the collection of light by the device including controlling collection efficiency, collection collimation, and/or collection isotropy. In such devices, tailoring of the collection collimation and isotropy can enable to collection of more light that impinges on the collection surface with specific orientations. For example, a high collection collimation enables the device to collect light that is impinging on the collection surface with orientations that do not significantly deviate from the emission surface normal, while at the same time, collecting less of the light that impinges on the collection surface with orientations that significantly deviate from the emission surface normal. Anisotropy further allows the collection to be enhanced along one or more directions (along the collection surface). Furthermore, the wavelength(s) of the collected light may also be tailored based on the pattern characteristics, for example the nearest neighbor distance between features of the pattern. Therefore, although the embodiments that follow are described in the context of light-emitting devices, it should be appreciated that the invention is not limited in this respect. For instance, the structures described herein can also be incorporated into light-collection devices, as previously described.

The schematic representation of the LED 100 illustrates angles θ and φ that can be used to characterize light emission from the emission surface 118. Light emission from the emission surface can be characterized by a light emission field, where the direction of the light emission field at any point corresponds to the direction of propagation of the emitted light at that point.

A light emission pattern can in turn be defined by the spatial distribution of the light intensity emanating from the light-emitting device. From a calculation standpoint, the light intensity at a point in space can be determined by the magnitude of the light emission field. A light emission pattern can be used to determine the projection of light onto a projection plane, or any other desired surface. Such a procedure can be useful for calculating an emission pattern of light onto a projection plane, where the projection plane is typically parallel to the emission surface. For example, the projection plane may be a plane parallel to the emission surface, and for example, can be located at a far-field distance from the emission surface so as to capture the far-field emission pattern. In embodiments presented herein, an emission pattern refers to an intensity pattern on a projection plane substantially parallel to the emission surface. In instances where the emission surface is not parallel to the active layer (e.g., a quantum well), the emission pattern can refer to an intensity pattern on a projection plane substantially parallel to the active layer.

To facilitate a description of collimation and/or isotropy of emitted light, suitable coordinate systems may be employed. In a spherical coordinate system, an emission vector 102 can be defined by a polar angle θ between a normal of the emission surface and the emission vector, and by an azimuthal angle φ on a plane defined by the emission surface. The definition of these angles can facilitate a description of the collimation and isotropy of the emitted light. In such a spherical coordinate system, collimation is a measure of the polar angular variation of the light emission. Azimuthal isotropy is a measure of the isotropy of the light emission versus the azimuthal angle, hereafter referred to simply as isotropy. In a mathematical sense, the azimuthal isotropy can be related to the variation of the emitted light intensity versus the azimuthal angle, for a constant polar angle.

The emission pattern, and hence collimation and/or isotropy of the emitted light, may be characterized based on collection shapes or surfaces within which, or on which, emitted light can be integrated so as to determine the total light emission within, or on, that collection shape. Some examples of collection shapes include a solid angle collection cone, a collection plane, or sets of collection planes, but other collection shapes are also possible.

Figure 2A:
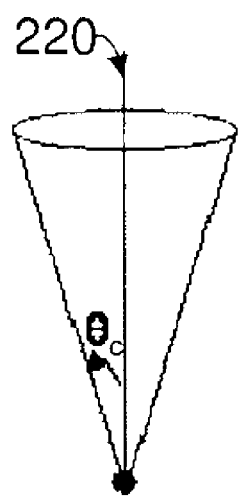
FIG. 2a is a schematic of a solid angle collection cone.

FIG. 2a illustrates a solid angle collection cone 200a defined by a polar angle $\theta_c$, referred to as a collection angle, with respect to a normal 220 of the emission surface (not shown). A solid angle cone with a specified collection angle can be used to characterize the collimation of the emitted light. The total intensity of light collected within the solid angle cone can provide a measure of collimation. In some embodiments, the collection angle used to characterize the degree of collimation is greater than or equal to about 20 degrees and less than or equal to about 45 degrees, for example, the collection angle may be 30 degrees.

The variation of the total intensity of light collected within the solid angle cone as a function of the collection angle $\theta_c$ can be compared to a Lambertian distribution exhibited by light-emitting devices not possessing any surface patterns, or other features, that modify light emission. It should also be appreciated that the variation of the light emission as a function of the azimuthal angle may be used to characterize the anisotropy of the light emission.

Figure 2B:
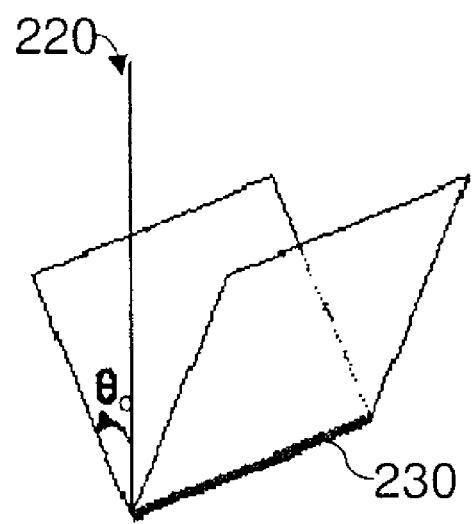
FIG. 2b is a schematic of a collection shape defined by a corresponding set of planes.

Other collection shapes may be utilized to facilitate the description of anisotropic light emission. In some instances, a suitable collection shape may be a set of planes having angles $\theta_c$ and $-\theta_c$ with respect to the emission surface normal 220, and containing a common line 230 which lies on the emission surface (not shown), as illustrated in FIG. 2b. To characterize anisotropy using such a collection shape, a first integrated collection intensity versus the collection angle can be obtained for a first orientation of line 230 on the emission surface (e.g., line 230 along an x or y axis). Then, a second integrated collection intensity versus the collection angle can also be obtained for a perpendicular orientation of line 230. In this way, a measure of light emission collimation in different emission directions may be obtained, which can therefore provide an indication of the anisotropy of the emission. It should be appreciated that the previously described collection shapes are merely some examples of collection shapes that may be used to characterize the collimation and/or isotropy (or anisotropy) of light emitted from a light-emitting device, and that the embodiments presented herein are not limited in this respect.

In some embodiments, a pattern on an interface of a light-emitting device can be used to tailor the collimation and/or isotropy of the emitted light. The pattern on the interface of the light-emitting device can influence the emission of light so as to generate substantially isotropic collimated emission. In other embodiments, the pattern on an interface of a light-emitting device may influence the emission of light so as to generate anisotropic light emission. The light emission may be collimated along a first axis (on the emission surface) and non-collimated along a second axis (also on the emission surface). In some embodiments, the first axis is perpendicular to the second axis.

Figure 3:
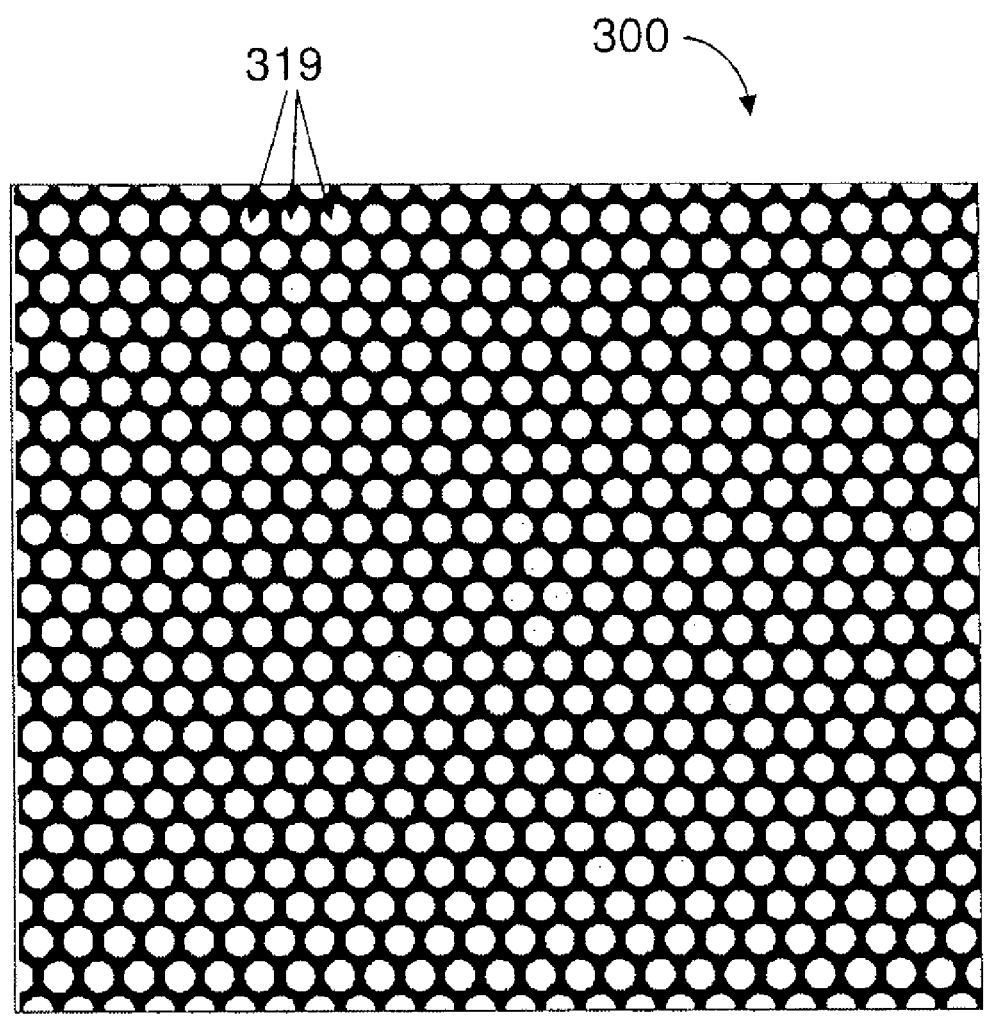
FIG. 3 is a pattern formed by a hexagonal array of features.

Patterns that can facilitate the tailoring of light emission may conform to various arrangements of features (e.g., at an interface, such as on an emission surface). In some embodiments, the arrangement of the features may be chosen based on a various techniques, as described in detail below. A pattern that has been incorporated at an interface within a light-emitting device is shown in FIG. 3. The pattern 300 comprises a hexagonal array of features 319 (e.g., openings) arranged to conform to a hexagonal lattice. Such a pattern may be used as a starting pattern (hereafter referred to as a precursor pattern) so as to generate other patterns based on various methods that shall be further described below. Although the hexagonal precursor pattern shall be used to illustrate various embodiments, other precursor patterns may also be employed, including any other periodic or non-periodic pattern.

In various embodiments, a pattern can be generated by transforming a precursor pattern according to a mathematical function. It should be understood that, as used herein, a mathematical function does not include random operations. Any suitable mathematical function can be used. For example, the mathematical function may be expressed as a function f(x): x→x' that depends on a position vector x and generates a position vector x', where the position vectors belong to the space that the precursor pattern spans. In one embodiment, the transformation of the precursor pattern may be defined by mathematical function that depends on the radius from a specified origin on a surface (e.g., plane) containing the precursor pattern. In one embodiment, the transformation of the precursor pattern can include providing an angular displacement to features of the precursor pattern, wherein the angular displacement may be given by a mathematical function that depends on the radial distance of the features of the precursor pattern with respect to a reference origin, as can be described by a function f(r), where r is the radial distance. In one embodiment, the transformation of the precursor pattern may be defined by a mathematical function that can depend sinusoidally on a distance from a reference axis on the plane containing the precursor pattern (e.g., where the distance may be an x or y coordinate value), as can be described by a function f(x) including sin(x) and/or sin(y) factor(s) and/or terms.

The precursor pattern is an initial pattern that need not have any physical manifestation and that may be transformed so as to generate a pattern, also referred to as a transformed pattern. In some embodiments, the precursor pattern may be periodic (e.g., having a simple repeat cell, or having a complex repeat super-cell), periodic with de-tuning, or non-periodic. Examples of periodic patterns include rectangular patterns and hexagonal patterns. Examples of non-periodic patterns include quasi-crystal patterns, for example, quasi-crystal patterns having 8-fold symmetry. The transformation of the precursor pattern may comprise transforming the location of features that form the precursor pattern so as to generate a transformed pattern having different feature locations. In some embodiments, the feature locations of the transformed pattern are not simply related to the precursor pattern feature locations based on only a translation and/or rotation.

In some embodiments, the precursor pattern may be defined by features that lie on a two-dimensional plane, and which may be transformed so as to generate a transformed pattern having features that lie on the same two-dimensional plane. The transformation may be defined by a mathematical function that depends on positions on the two-dimensional plane. The mathematical function can be represented in any number of suitable coordinate systems, including, but not limited to, a Cartesian coordinate system (having coordinates x and y) or a polar coordinate system (having coordinates r and φ). Examples of mathematical functions that can be used for the transformation include an angular displacement that at least depends on a radial distance from a reference origin, sinusoidal functions that depend on a distance from a reference axis (e.g., the x or y axis on the two-dimensional plane), scaling functions that depend on a position along a reference axis (e.g., elongation or compression along an x or y axis), or combinations thereof. It should be appreciated that these are just a few examples of suitable mathematical functions that may be used to accomplish the transformation of the precursor pattern, and other suitable mathematical function may also be used.

The precursor pattern may be transformed via the transformation of the feature positions of the precursor pattern. In one embodiment, a point within each feature is transformed but the shape and orientation of the features remains invariant. In another embodiment, all points within each feature are transformed, therefore resulting in a transformation of the shape and orientation of each feature.

In some embodiments, a pattern conforms to a transformation of a precursor pattern, wherein the transformation comprises an angular displacement transformation. For example, a mathematical transformation can be applied to a precursor pattern to create a twist of the precursor pattern. Such a transformation can be applied such that a displacement angle is applied to each feature of the precursor pattern where the displacement angle may be a function of a distance to a chosen center point, or reference origin, on a precursor pattern.

Figure 4:
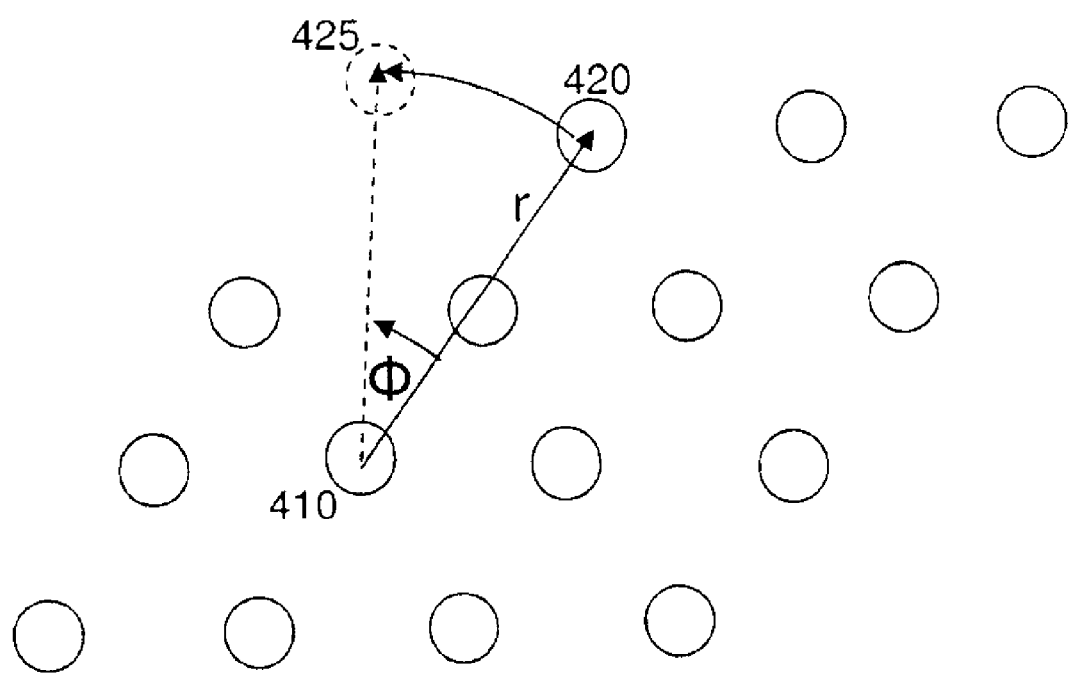
FIG. 4 is an illustration of an angular displacement transformation according to some embodiments of the invention.

A schematic showing how an angular displacement transformation can be applied to a precursor pattern is show in FIG. 4, where φ is an angular displacement and r is the radial distance from a chosen center feature 410. In the illustration, a feature point 420 of the precursor pattern is rotated by the angle φ, so as to transform the location of the feature 420 to location 425. The angular displacement φ can have a desired variation (or lack thereof) as a function of position. For example, the angular displacement φ can be constant for all features, or the angular displacement can vary as a function of a distance r from the reference origin 610 and/or x, y coordinates with respect to reference origin 610. In general, a local deformation of a precursor pattern can be defined as $$a = r\frac{d\phi(r)}{dr}\Delta r,$$

where "a" represents a circumferential displacement of a feature point with respect to the chosen center point from which the radius r is measured.

An example of a constant angle angular displacement transformation is given by $$a = r d\phi = const \rightarrow \phi(r) \sim ln(r),$$

where the transformed feature points experience the same circumferential displacement with respect to the chosen center point.

An example of an equal angle displacement transformation may be given by $$2\pi \int_0^1 r\phi(r)dr = \pi/2 \rightarrow \phi(r) \sim r^2,$$

where r=0 at the chosen center of the pattern and r=1 at the edge of the pattern. In this way, the transformation can also depend on the pattern size.

In some embodiments, an angular displacement transformation can have any type of functional dependence on the radius r. A general classification for angular displacement transformations that depend on the radial distance to a reference origin can be given by φ~T(r), where T(r) is a transformation function which varies with the radius r from the reference origin. Examples of such transformations include $$\phi(r) \sim \sqrt[n+r]{r} \text{ and}$$

$$\phi(r) \sim \sqrt[n]{r},$$

where n is a constant.

Figure 5A:
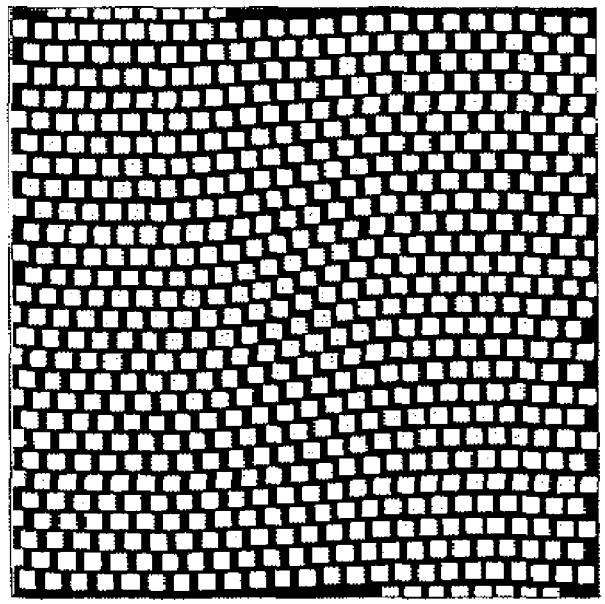
FIGS. 5a-b are patterns generated by an angular displacement transformation of a precursor pattern according to some embodiments of the invention.

An illustrative embodiment of such a pattern generated by an angular displacement transformation of a precursor pattern is shown in FIG. 5a, where the mathematical function used for the transformation was given by $$\phi \sim \sqrt[8]{r}$$

and the reference origin (not shown) lies in the center of the pattern, thereby generating a twist of the precursor pattern. In this example, the precursor pattern was a periodic hexagonal pattern, but it should be appreciated that other precursor patterns may also be used, as previously described. For example, some other periodic precursor patterns that may be utilized include a square pattern or a rectangular pattern. Furthermore, non-periodic patterns may also be used as precursor patterns. In addition, although the pattern in the illustrative embodiment shown in FIG. 5a was formed using an angular displacement transformation according to a mathematical function $$\phi \sim \sqrt[8]{r},$$

other angular displacement transformations can be used.

In some embodiments, a pattern may include one or more portions of a transformed pattern conforming to a transformation of a precursor pattern. For example, the transformation may be an angular displacement transformation of a precursor pattern, as discussed above. The pattern may comprise a plurality of cells, where each cell includes a portion of an angular displacement transformation of a precursor pattern. The cells can include the same portion or different portions of the transformed pattern, and can be arranged in a periodic or non-periodic arrangement.

Figure 5B:
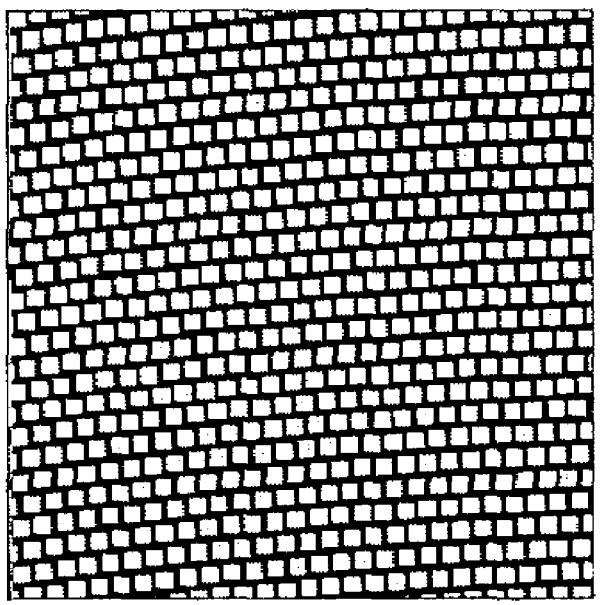

An illustrative embodiment of a portion of an angular displacement transformation of a precursor pattern is shown in FIG. 5b, where the mathematical function used for the transformation was given by φ=ln(r) and the reference origin lies off the illustrated pattern portion. In this instance, the precursor pattern was a periodic hexagonal pattern, but as previously stated, other precursor patterns may be utilized.

Figure 6:
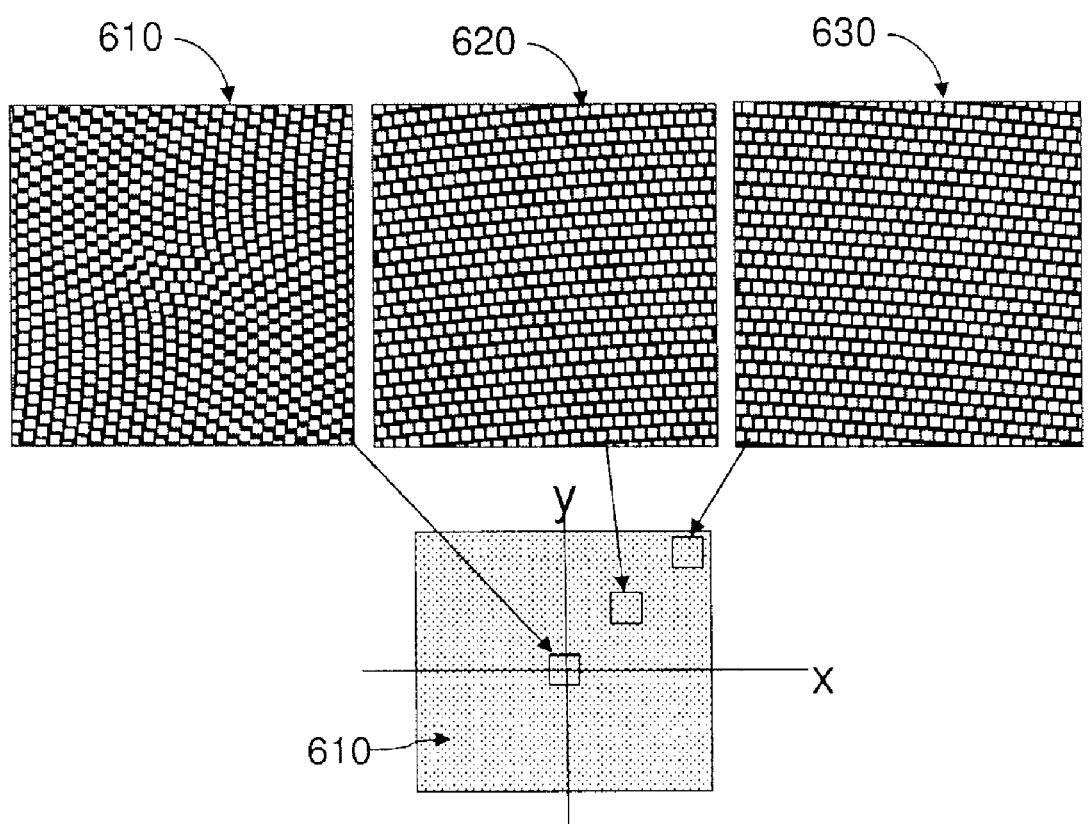
FIG. 6 is a schematic representation of a transformed pattern, from which portions may be selected, according to some embodiments of the invention.

To further explain a method by which portions of a transformed pattern may be generated, FIG. 6 illustrates a schematic representation of a transformed pattern 610, from which portions 610, 620, and 630 may be selected. In one embodiment, the transformed pattern 610 conforms to an angular displacement transformation of a hexagonal precursor pattern, where the transformation was given by φ=ln(r). The specific pattern portions 610, 620, and 630 that are illustrated in FIG. 6 correspond to portions of the aforementioned transformation of a hexagonal precursor. A new pattern can be created by arraying a selected pattern portion (e.g., 610, 620, or 630) in a periodic or non-periodic fashion. For example, cells including any of the portions can be arranged in an array (e.g., a rectangular array) so as to form a periodic complex-cell pattern. In other instances, more than one selected portion may be arranged in any desired configuration.

In some embodiments, a pattern can comprise a plurality of regions each having a pattern related to the pattern in one of the other regions by a rotation. Such patterns may be referred to as rotated patchwork patterns. Each of the regions can be referred to as cells, and the cells can have any shape and be arranged in any desired manner. Possible shapes for the cells include triangles, squares, rectangles, hexagons, or even irregular shapes. The cells can have any desired size, and need not necessarily all have the same size. The pattern within each cell may be any pattern, including non-periodic and periodic patterns, including but not limited to hexagonal or rectangular patterns.

Figure 7:
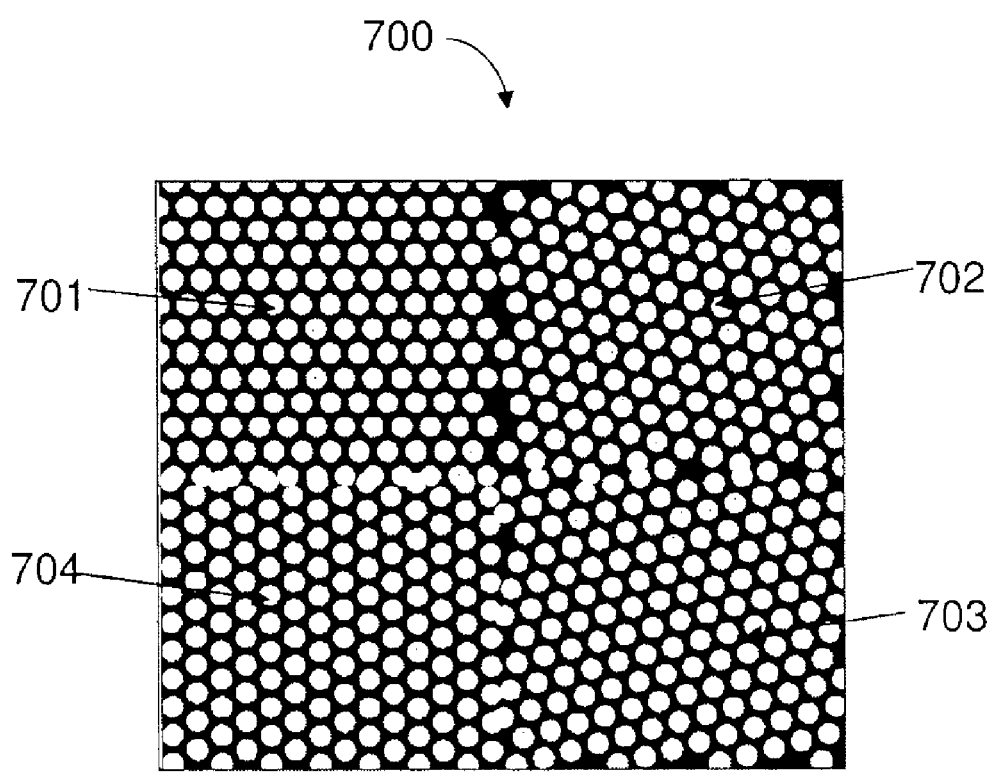
FIG. 7 is a rotated patchwork pattern according to some embodiments of the invention.

FIG. 7 illustrates a rotated patchwork pattern 700 including multiple cells that each include a rotated portion of a hexagonal pattern. The multiple cells 701, 702, 703, and 704 are rotated with respect to one another by specific angles. The angle of rotation is 0 degrees for cell 701, 15 degrees to the right for cell 702, 15 degrees to the left for cell 703, and 90 degrees for cell 704.

Multiple cells and rotations are possible. In some embodiments, the rotation of the cells can vary randomly with respect to the adjacent cells. In other embodiments, the rotation of the cells can vary according to a desired rotation angle. For example, each cell could be rotated 15 degrees with respect to an adjacent cell. In addition various cell sizes can be used. Exemplary cell lengths (and/or widths) include about 5 microns, about 10 microns, about 25 microns, about 50 microns, about 100 microns, and about 200 microns. In some embodiments, cells can have areas greater than about 100 microns$^2$ (e.g., 10×10 microns) and/or less than about 40000 microns$^2$ (e.g., 200×200 microns). In one embodiment, cells have and area of about 1000 microns$^2$ (e.g., 33×33 microns).

Furthermore, the cells need not necessarily be contiguous and may be separated by regions having other patterns, or no patterning at all. Also, it should be appreciated that the cells may have patterns related by more than just a rotation. For example, some cells may have patterns that are both rotated and further transformed in some other manner, including, but not limited to, scaling such a compression and/or elongation along one of more axes.

In some embodiments, a pattern includes extended gap regions in one or more directions. Within the extended gap regions, pattern features may be absent and/or may have altered characteristics (e.g., feature sizes) so as to differentiate the extended gap regions from other regions of the pattern. In some embodiments, rows and/or columns of features may be absent from a pattern at selected locations. The extended gaps may be separated by a desired distance or number of features.

Figure 8A:
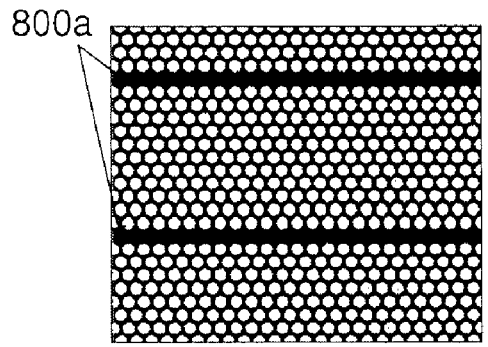
FIGS. 8a-d are patterns having extended gap regions according to some embodiments of the invention.
Figure 8B:
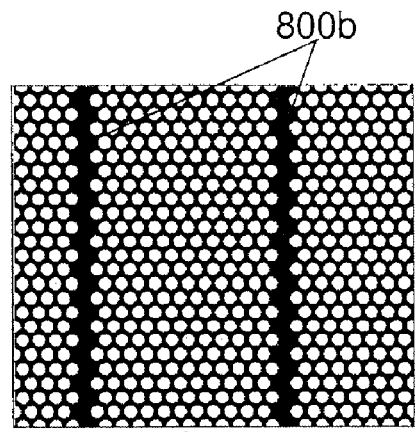
Figure 8C:
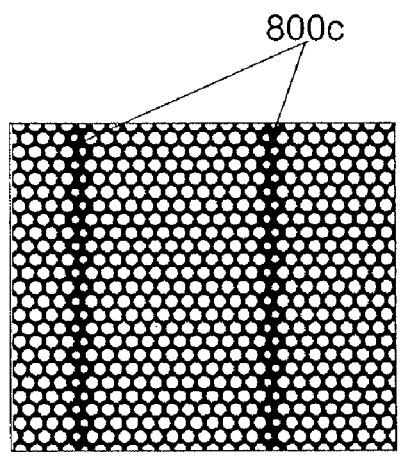
Figure 8D:
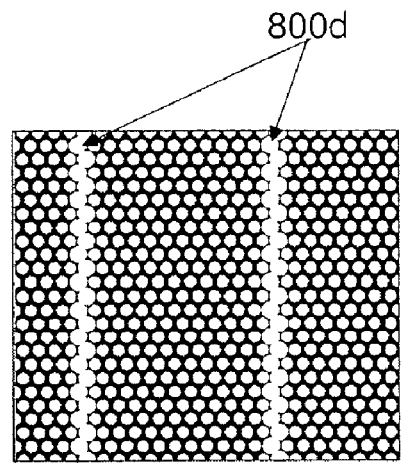

FIGS. 8a-d illustrate various hexagonal patterns having extended gap regions. It should be appreciated that although these patterns are based on a hexagonal pattern of features, any other periodic or non-periodic pattern may be modified via the incorporation of similar extended gaps. FIG. 8a illustrates a hexagonal pattern having extended gaps 800a comprising rows of missing features. FIG. 8b illustrates a hexagonal pattern having extended gaps 800b comprising columns of missing features. FIGS. 8c-d illustrate hexagonal patterns where extended gaps are formed by a modification of the feature characteristics within the extended gap regions. In particular, FIG. 8c illustrates a hexagonal pattern having extended gaps 800c comprising columns of features having smaller sizes (e.g., diameters) than features in the other regions of the pattern. FIG. 8d illustrates a hexagonal pattern having extended gaps 800d comprising columns wherein the features meld together, which may be viewed as the features having larger sizes (e.g., diameters) than their nearest neighbor distance. These are just some examples that illustrate ways by which extended gaps may be formed given a starting pattern.

Figure 9A:
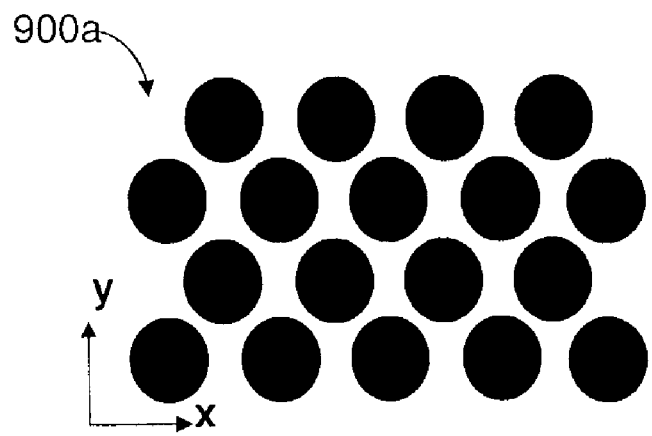
FIG. 9a is a hexagonal pattern.
Figure 9B:
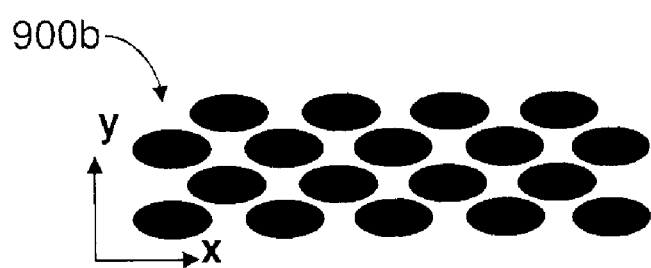
FIG. 9b-c are patterns generated by scaling according to some embodiments of the invention.
Figure 9C:
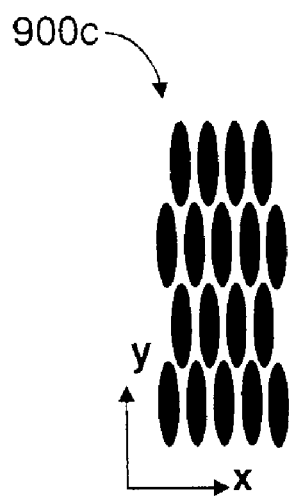

In some embodiments, a pattern may be spatially compressed along one direction and/or spatially elongated along another direction. Elongation and/or compression (also referred to generally as scaling) of patterns along one or more directions may enable the generation of anisotropic patterns. An example of an elongation or compression transformation along the x-axis and/or y-axis may be defined mathematically according to a function $f(x=(x,y))=(k_x x, k_y y)$, where $k_x$ and $k_y$ are scaling factors along the x and y directions, respectively. For compression, the scaling factor is less than 1, and for elongation, the scaling factor is greater than 1. It should be appreciated scaling can be performed along any desired axis, and need not just be performed along the x and/or y axis. FIGS. 9b-c illustrate examples of patterns that conform to the elongation and/or compression of a hexagonal pattern 900a shown in FIG. 9a. FIG. 9b illustrates a pattern 900b that conforms to the compression along the y direction of hexagonal pattern 900a. FIG. 9c illustrates a pattern 900c that conforms to compression along the x direction. In another embodiment, a pattern can conform to the compression of a precursor pattern along a first direction, and an elongation of a precursor pattern along a second direction. The first and the second directions can be perpendicular, but need not necessarily be so. Using such methods, patterns can be generated that have anisotropic features and nearest neighbor distances. Some variations include the introduction of compression and/or elongation for only the features and/or the locations of the features.

Figure 10:
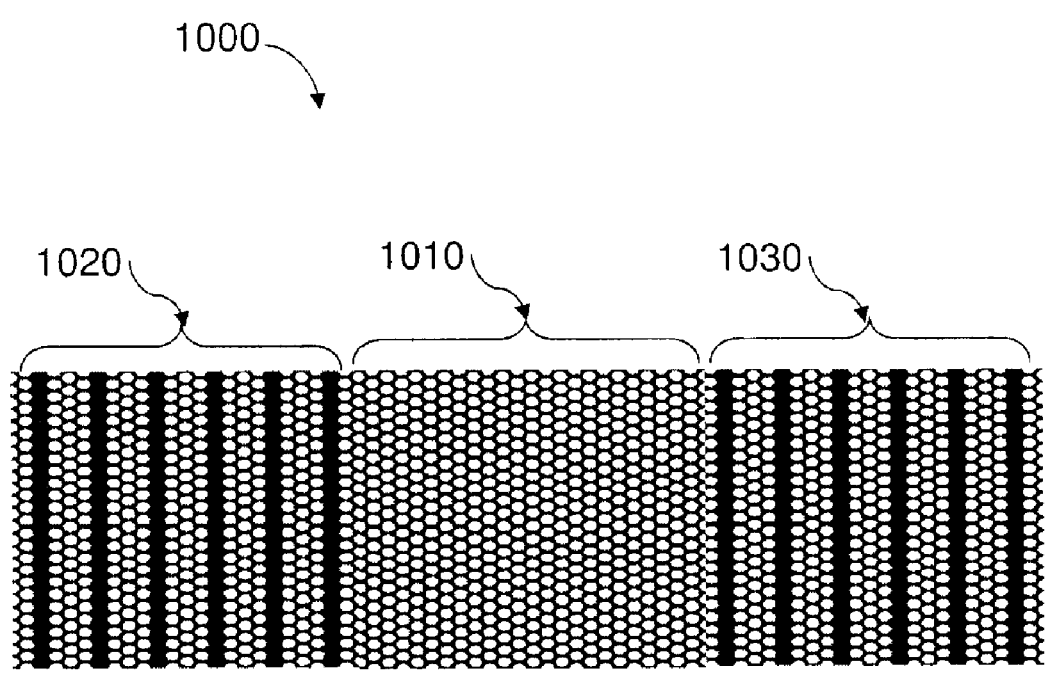
FIG. 10 is a pattern that includes a plurality of regions with a specific pattern according to some embodiments of the invention.

In some embodiments, a pattern can comprise a plurality of regions, wherein each region can include a specific pattern. For example, regions of a pattern may include any of the patterns mentioned herein, but can also include any other pattern. FIG. 10 illustrates such an embodiment, where the pattern 1000 comprises three regions 1010, 1020, and 1030. Regions 1010 and 1030 are regions with a pattern that includes extended gaps, whereas center region 1020 includes a hexagonal pattern without any missing features. Other variations of such an embodiment are possible, where any other patterns may be used in various regions.

Once a pattern is generated, it may be incorporated into a variety of devices, including, but not limited to, light-emitting devices and light-collection devices. In one embodiment, a pattern may be incorporated into a device such that an interface (e.g., an emission surface and/or buried interface) of the device has a dielectric function that varies spatially according to a transformed pattern. The variation in the dielectric function may be accomplished by a variety of means, including but not limited to incorporating openings (or protrusions) in locations where a pattern feature should be located. In some embodiments, the pattern may lie at an interface between two material layers.

As previously mentioned, patterned interfaces in light-emitting (and light-collection) devices can be used to tailor the light emission profile of such devices. The pattern can influence the collimation and isotropy of the light emission. In instances where a pattern is absent, the emission profile of a light-emitting device (without any collection optics) is known to have a Lambertian distribution dependent on the collection angle from the emission normal. In contrast, in some embodiments presented herein, the dielectric function of an interface of a light-emitting device varies spatially according to a pattern, and the pattern is arranged so that light generated within the light-emitting device emerges with an emission profile that is more collimated than a Lambertian distribution. In some embodiments, a pattern can enable the tailoring of light emission so that the emission is both collimated and isotropic. As described herein, the degree of collimation may be defined in relation to a Lambertian emission distribution. Light emission can be considered collimated when the intensity of the emitted light at a direction normal (i.e., zero collection angle) to the emission surface is at least about 20% greater (e.g., at least about 30% greater, at least about 50% greater, at least about 100% greater) than a Lambertian emission at a direction normal to the emission interface.

Figure 11A:
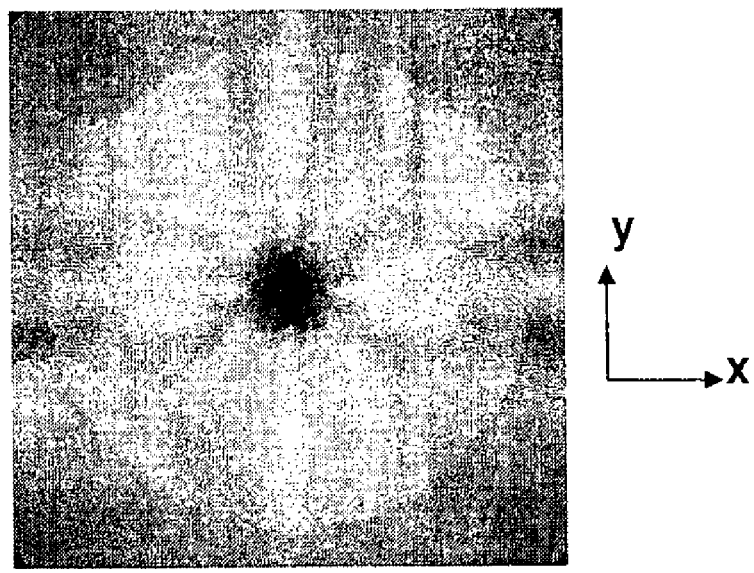
FIG. 11a is an illustration of a simulated emission pattern that is both collimated and substantially uniform according to some embodiments of the invention.

FIG. 11a illustrates a simulated emission pattern that is both collimated and substantially isotropic, where light regions correspond to areas of higher emission intensity. Various patterns can be used to provide such collimated isotropic emission, including, but not limited to, the patterns illustrated in FIG. 5a and FIG. 7. In some embodiments, a pattern that conforms to an angular displacement transformation of a precursor pattern can be used to pattern the emission surface of a light-emitting device to provide for light emission that is both collimated and substantially isotropic. In other embodiments, a rotated patchwork pattern may be used to provide for light emission that is both collimated and substantially isotropic. As described herein, a substantially isotropic emission may be defined such that an integrated intensity varies by less than about 20% (e.g., less than about 10%, less than about 5%) over all azimuthal angles, wherein the integrated intensity is a summed intensity over all polar collection angles.

Figure 11B:
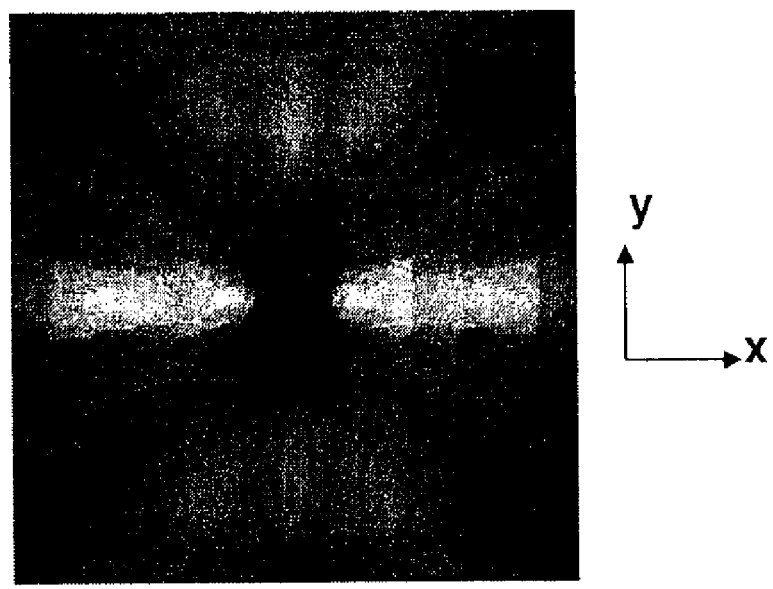
FIG. 11b is an illustration of a simulated emission pattern that is collimated along one axis and non-collimated along another axis according to some embodiments of the invention.

Furthermore, in other embodiments, a pattern can enable the tailoring of the light emission in one or more directions to create a partially collimated beam. In some embodiments, a pattern can be configured so as to generate anisotropic light emission. The anisotropic light emission may be characterized by an emission pattern on a far-field projection plane substantially parallel to the interface, wherein a first total light intensity along a first axis (e.g., x-axis or y-axis) on the projection plane is at least 20% greater than a second total light intensity along a second axis (e.g., y-axis or x-axis) on the projection plane. In some embodiments, the second axis is perpendicular to the first axis, and in further embodiments, the first total light intensity along the first axis is at least 50% greater (e.g., at least 75% greater, at least 100% greater) than the second total light intensity along the second axis. FIG. 11b illustrates a simulated anisotropic emission pattern that is collimated along one axis and non-collimated (e.g., Lambertian) along the other axis. Various patterns can be used to accomplish such partially collimated anisotropic emission, including, but not limited to, the patterns illustrated in FIG. 5b and FIGS. 8a-d. In some embodiments, a pattern that conforms to a portion of angular displacement transformation of a precursor pattern can be used to pattern the emission surface of a light-emitting device, wherein the resulting light emission is anisotropic and collimated along a desired axis. In other embodiments, a pattern having extended gaps may result in emission that is anisotropic and collimated along a desired axis.

It is believed that a patterned light projection profile may be generated using a light-emitting device with a surface having multiple patterns which are spatially separate from one another. Both collimating and non-collimating patterns can be sectioned together. An example of such an embodiment is shown in FIG. 10, where the pattern consists of a center region that can provide for highly collimated emission, and the edge pattern regions that can provide for anisotropic emission. Other arrangements are possible depending on the desired projection pattern.

Various devices (e.g., light-emitting devices, light-collection devices) incorporating patterns, such as those described above, can be used in various components and systems. Light-emitting devices having partially collimated anisotropic emission may be incorporated into components and systems that may be suited for anisotropic emission profiles, including but not limited to, applications such as edge illumination of a light panel (e.g., for use in an LCD display or for general illumination), rear projection televisions, and far-field manipulation for projection applications (e.g., decorative lighting, automotive headlamps).

Figure 12:
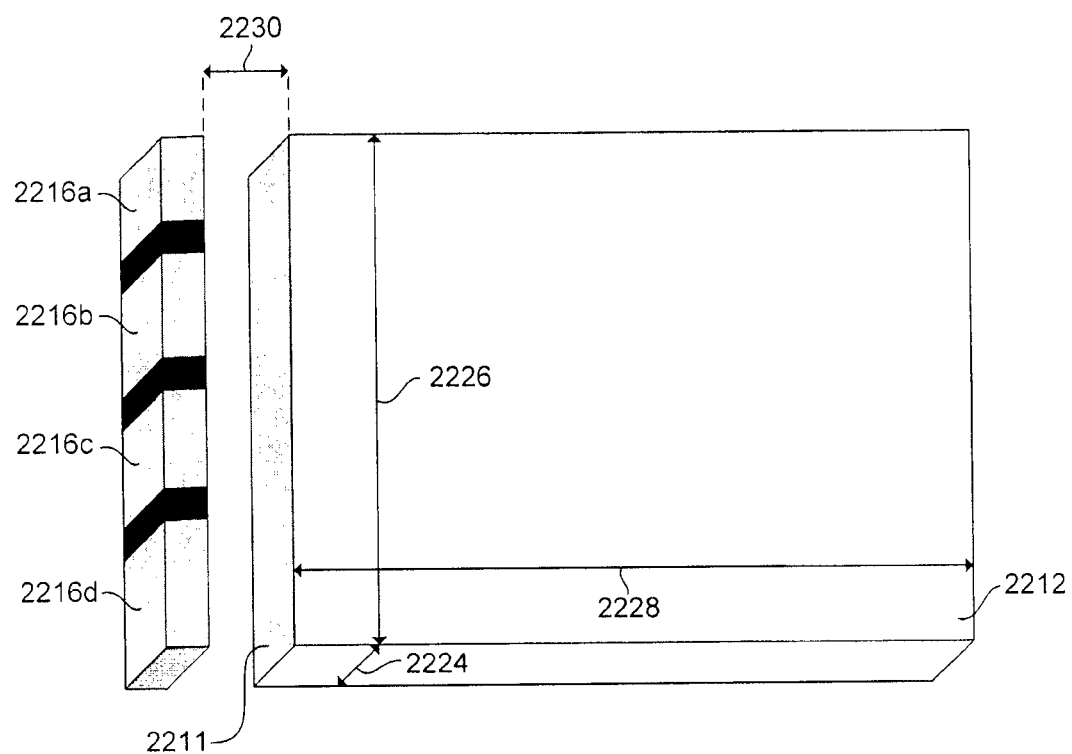
FIG. 12 is a schematic of an edge-illuminated light panel according to some embodiments of the invention.
Figure 13A:
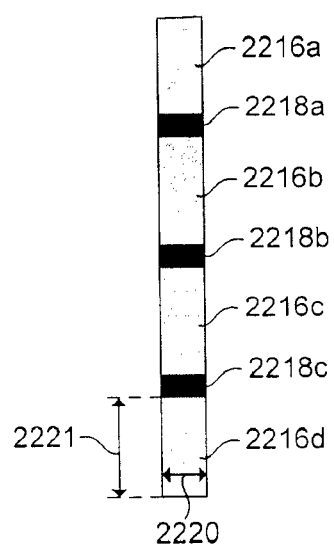
FIG. 13a is a view of the LEDs in the edge-illuminated light panel of FIG. 12 according to some embodiments of the invention.
Figure 13B:
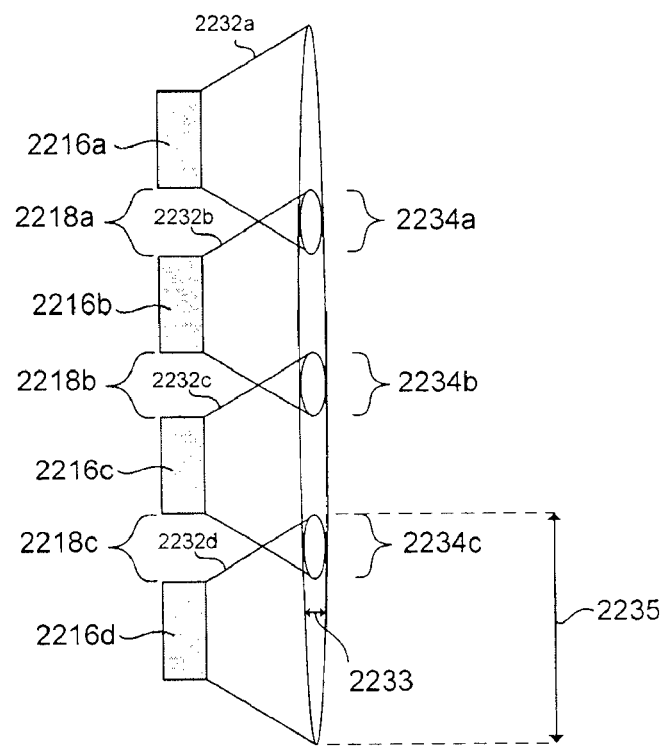
FIG. 13b is a schematic of light emission from the array of LEDs in the edge-illuminated light panel of FIG. 12 according to some embodiments of the invention.

FIGS. 12 and 13a-b illustrate an embodiment of an edge-illuminated light panel (e.g., in an LCD assembly, where an LCD layer is disposed over an illumination panel) including LEDs having partially collimated anisotropic emission. Such partially collimated light output can increase the coupling of the light emitted from LEDs 2216a, 2216b, 2216c, and 2216d into light panel 2212 and can also enhance the mixing and distribution of the light within the panel. A LED having a patterned surface can generate a light distribution that is collimated along one direction and non-collimated along a different direction, such as the simulated emission illustrated in FIG. 11b. Such patterns can include, but are not limited to, the patterns presented in FIGS. 5b, 8a-d, and 9b-c, as shall be described further below in working examples.

LEDs 2216a, 2216b, 2216c, and 2216d can be positioned along the edge 2211 of light panel 2212, in a manner illustrated in the perspective view of FIG. 12 and the side-view of FIG. 13a. The LEDs 2216a, 2216b, 2216c, and 2216d may be arranged so as to be separated by non-light generating regions 2218a, 2218b, and 2218c. The LED arrangement can generate a light distribution that includes regions of overlapping light projection, schematically shown as elongated cones 2232a, 2232b, 2232c, and 2232d with overlapping regions 2234a, 2234b, and 2234c. As shown in FIG. 13b, the light distribution is more collimated than a typical Lambertian light emission in the direction parallel to thickness 2224 of LCD panel 2212 (indicated by arrow 2233). The surface pattern can also enhance spreading of the light in another direction (indicated by arrow 2235), for example, in a direction perpendicular to the thickness of the display. A LED having a surface pattern that enhances collimation along the thickness of LCD panel 2212 and allows for a diffused distribution along the length of the LCD panel 2212 can enhance the isotropy of the light distribution entering LCD panel 2212. For example, the diffused distribution can spread light from the multiple LEDs (e.g., LEDs 2216a, 2216b, 2216c, and 2216d) to reduce the effect of the spacing or non-light generating regions (e.g., regions 2218a, 2218b, and 2218c) between the LEDs.

Having thus described both patterns that can be incorporated into light-emitting devices, and systems within which such light-emitting devices may be incorporated, it should be appreciated that such light-emitting devices can be formed with a variety of processes and methods known to those in the art. Device structures described in the embodiments can be fabricated using a combination of any suitable processing techniques. Such processes can include thin film deposition techniques, such as chemical vapor deposition (e.g., metal-organic chemical vapor deposition), for depositing various materials, including semiconductors, insulators, and metals. Evaporation and sputtering can be utilized to deposit metals. Patterning processes, such as photo-lithography and nano-imprint techniques, may be used to form the surface patterns described herein. Etching processes, such as dry etching (e.g., reactive ion etching), and wet etching, may be used to pattern layers. Coating and spin-coating can be used to deposit encapsulants. Wafer bonding processes may be used to transfer structures and devices. Furthermore, packaging processes may be used to package the aforementioned light-emitting devices and structures.

Patterns which can enable a tailoring of the collimation and/or isotropy of the light emission may include any of the types of pattern described herein, but are not limited to just the patterns illustrated herein. Such patterns may be generated via any of the methods described herein, or by any other suitable method, including direct selection of pattern feature locations. As previously described, a pattern to be incorporated into a device may be generated by a transformation of a precursor pattern. Such a transformation may be performed on a computer via a mathematical transformation of a set of points describing the locations of pattern features, or by any other means, as the invention is not limited in this respect. Once a desired pattern is generated or selected, thereby yielding a location of features, a patterning mask may be created and used to incorporate the pattern onto a layer of a device. The patterning process for the pattern may be performed with any suitable patterning process, including, but not limited to, photo-lithography and nano-imprint techniques.

In addition, pattern modification processes may be included in the fabrication process via techniques such as etching vias or trenches into the surface. In other pattern modification techniques, etching vias into the backside of the device (i.e., through a backside mirror layer) can influence the emission pattern (e.g., collimation and/or isotropy) of the light-emitting device. In other pattern modification processes, extended gaps such as those described in relation to FIGS. 8a-8d, can be fabricated using pattern modification process. In some embodiments, such as for the pattern shown in FIG. 8c, a portion of a pattern can be under-etched such that the periodicity of the pattern on the surface of the device is disrupted by a group of holes having a smaller diameter in comparison to the other holes in the pattern. In other embodiments, as shown in FIG. 8d, a portion of the pattern can be over-etched such that the periodicity of the pattern on the surface of the device is disrupted by a group of holes having a larger diameter in comparison to the other holes in the pattern. It should be appreciated that these are only some examples of pattern modification processes, and that other fabrication modifications are possible so as to facilitate the fabrication of patterns.

Working Examples

Some working examples are presented to illustrate various simulation results for LEDs incorporating some of the aforementioned patterns. It should be understood that these working examples do not limit the embodiments.

Hexagonal Pattern

Although collimated emission has been obtained in prior light-emitting devices having patterned surfaces (e.g., with hexagonal patterns), these emission profiles possessed an eight-fold symmetry, and were neither substantially isotropic nor anisotropic (e.g., having substantial collimation along only one axis in the emission surface plane). An example of such LEDs having a patterned surface that can provide a light emission profile that is more collimated than a Lambertian distribution is described in U.S. Patent Publication 2004/0207310A1 which is hereby incorporated by reference, which is based on U.S. patent application Ser. No. 10/724,029 filed on Nov. 26, 2003.

Figure 14:
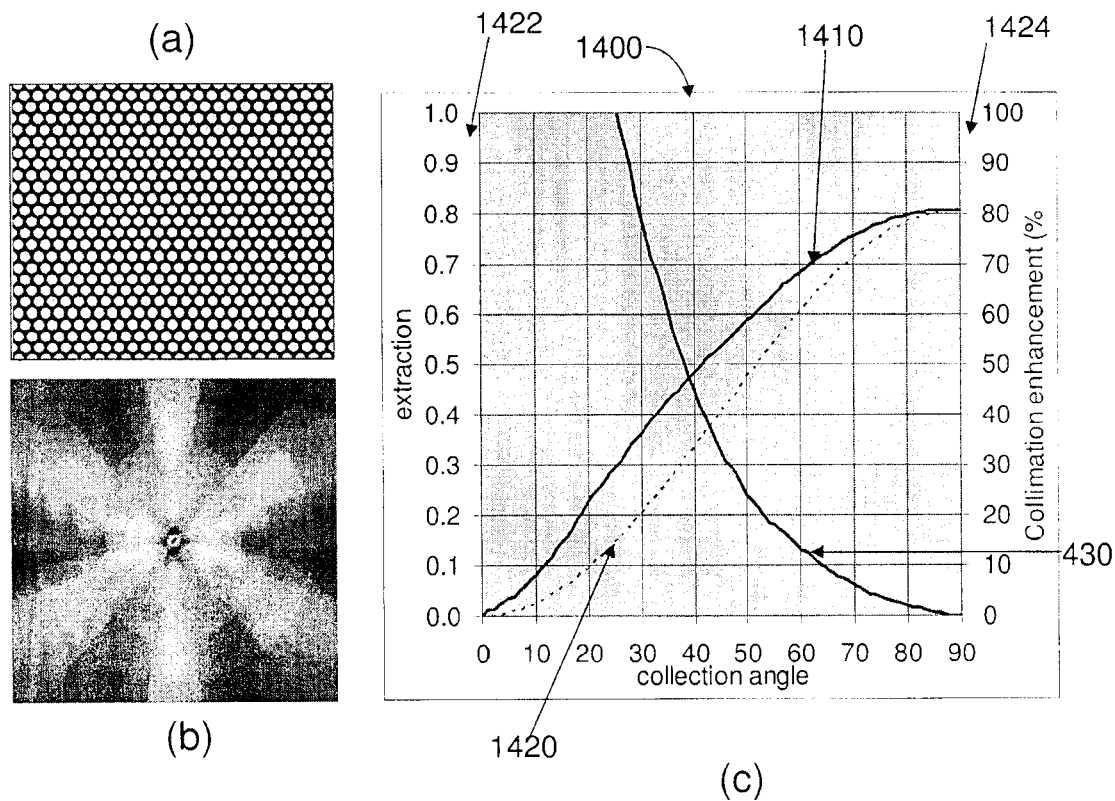
FIG. 14a-c are simulation results from a working example according to some embodiments of the invention.

A hexagonal pattern of holes on the emission surface of a LED has been previously demonstrated to create a collimated emission. Such a hexagonal surface pattern is shown in FIG. 14a, and a corresponding simulated emission pattern is shown in FIG. 14b. All simulation results presented herein were generated using a three-dimensional finite-difference time-domain (FDTD). The simulation parameters included an emission wavelength (in air) of 520 nm, an emission FWHM of 35 nm, a hexagonal array surface pattern formed of etched holes and having a lattice constant of 460 nm, hole diameters of 334 nm, hole side wall slopes of 90 deg, hole depths of 250 nm, and a hole filing ratio of 50% whereby the holes fill half of the emission surface. The LED stack used in the simulation was formed of, from bottom to top, a silver mirror, a p-GaN region having a thickness of 100 nm, an active region having a thickness of 85 nm, and a n-GaN region having a thickness of 350 nm. Unless stated otherwise, the simulation parameters for other illustrative working examples presented herein was generated via simulations using similar parameters, except for variations in the surface pattern.

FIG. 14c is a graph 1400 of the simulated light extraction from the device as a function of collection angle away from the surface normal, represented by data curve 1410. In these simulations, the collection shape was a solid angle collection cone, as previously described. The y-axis 1422 shown on the left side of graph 1400 is the light extraction, wherein a value of 1.0 corresponds to 100% of the light generated in the active region of the LED being extracted from the LED. The dotted line 1420 represents the profile of the extraction from a LED generating a Lambertian distribution. The y-axis 1424 plotted on the right side of graph 1400 shows the collimation enhancement over the Lambertian 1420, given by curve 1430.

Patchwork Pattern

Figure 15:
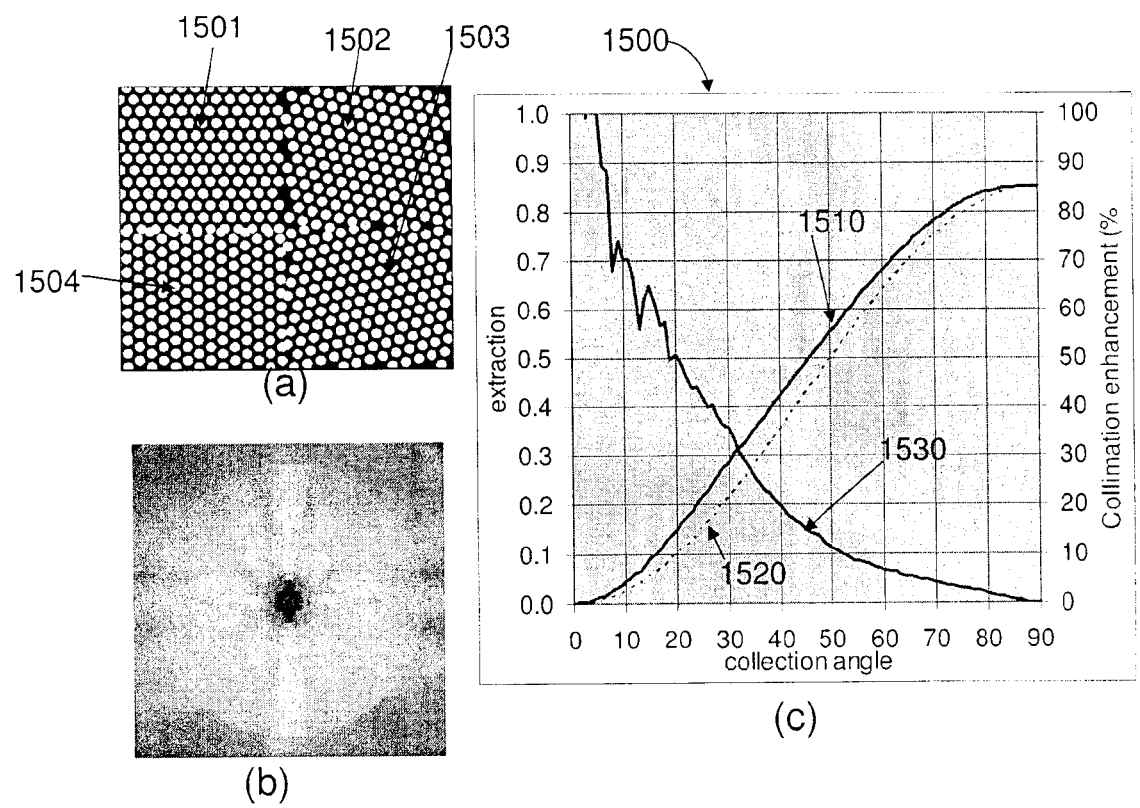
FIG. 15a-c are simulation results from a working example according to some embodiments of the invention.

In some embodiments, the surface of a light-emitting device can be patterned to generate a substantially isotropic emission pattern while maintaining collimation. In one embodiment, a patchwork pattern that generates a substantially isotropic emission while maintaining collimation is shown in FIGS. 15a-c. In the illustrated pattern of FIG. 15a, a cell size of 5.5×5.5 microns was used in a simulation of LED emission. FIG. 15b shows a simulated emission pattern, and FIG. 15c is a graph 1500 of the simulated light extraction from the device as a function of collection angle away from the surface normal, represented by data curve 1510. In this illustration, the collection shape was a solid angle collection cone. The dotted line 1520 represents the profile of the extraction from a LED with a Lambertian light emission distribution. The collimation enhancement over the Lambertian 1520 is given by curve 1530. This simulation illustrates that the surface pattern comprising of a plurality of patterned regions related by a rotation can increase the collimation as compared to a Lambertian distribution, while at the same time facilitate the generation of substantially isotropic emission, as illustrated in the emission pattern of FIG. 15b.

Angular Displacement Pattern

Figure 16:
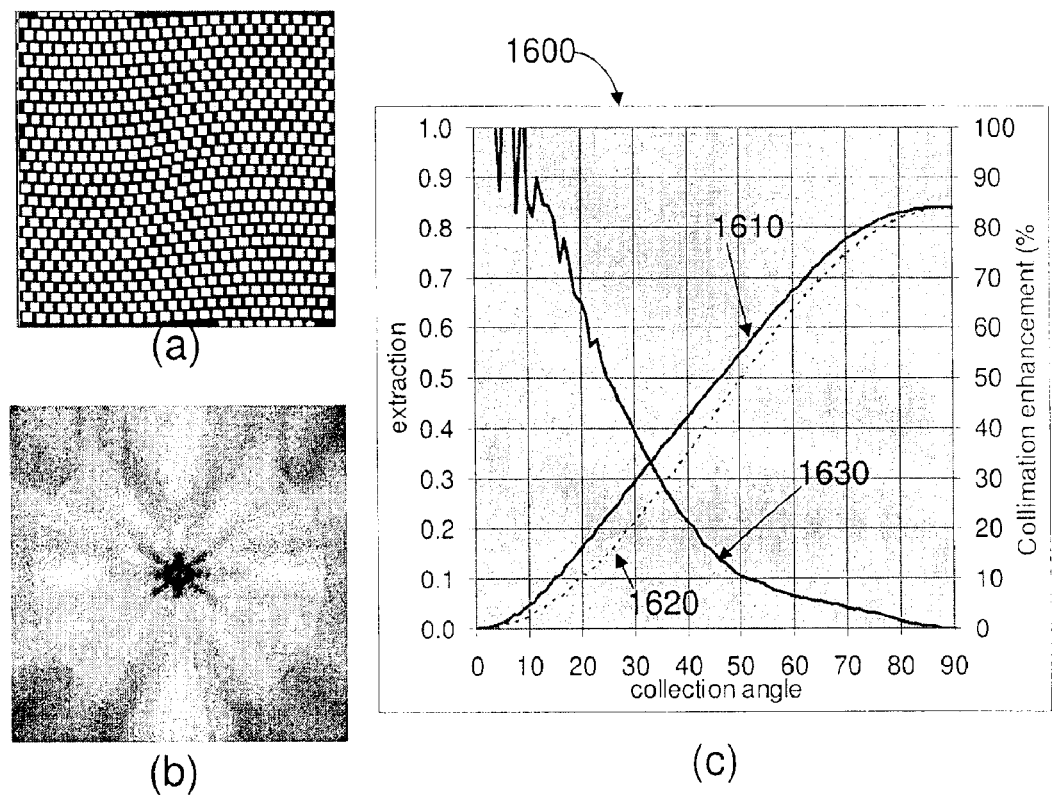
FIG. 16a-c are simulation results from a working example according to some embodiments of the invention.

Angular displacement patterns can be incorporated into a LED so as to facilitate the generation of a substantially isotropic and collimated emission pattern. FIG. 16a illustrates a pattern that conforms to an angular displacement transformation of a hexagonal precursor pattern, generated using an angular displacement transformation according to a mathematical function $$\phi \sim \sqrt[8]{r}.$$

FIGS. 16b-c are corresponding simulation results for the pattern shown in FIG. 16a. FIG. 16b shows a simulated emission pattern, and FIG. 16c is a graph 1600 of the simulated light extraction from the device as a function of collection angle away from the surface normal, represented by data curve 1610. In this illustration, the collection shape was a solid angle collection cone. The dotted line 1620 represents the profile of the extraction from a LED generating a Lambertian light emission distribution. The collimation enhancement over the Lambertian 1620 is given by curve 1630. The surface pattern conforming to an angular displacement transformation of a precursor pattern can increase the collimation as compared to a Lambertian distribution, and at the same time generate a substantially isotropic emission, as illustrated in the emission pattern of FIG. 16b.

Portion of an Angular Displacement Pattern

FIG. 17a illustrates a pattern which is a 100×100 micron portion of a transformed hexagonal pattern transformed according to the function $\phi=\ln(r)$. In particular, the pattern corresponds to portion 620 of the transformed pattern illustrated in FIG. 6. FIGS. 17b-d are corresponding simulation results for the pattern shown in FIG. 17a. The simulated emission pattern illustrated in FIG. 17b shows that the pattern in FIG. 17a provides for anisotropic emission.

To further describe such emission, a corresponding set of collection planes, as illustrated in FIG. 2b, can be used as a collection shape. Simulation data in graph 1700c of FIG. 17c illustrates the collected light emission within the corresponding set of planes as a function of collection angle from the surface normal. Emission as a function of collection angle for a Lambertian emission is given by curve 1720c. Curve 1712c is the total emission within a corresponding set of planes where the common line of intersection of the planes (i.e., line 230 in FIG. 2b) is aligned along the y-axis, as illustrated in FIG. 17e. Curve 1714c is the total emission within a corresponding set of planes where the common line of intersection of the planes (i.e., line 230 in FIG. 2b) is aligned along the x-axis, as illustrated in FIG. 17f.

To further illustrate the anisotropy of the emission, FIG. 17d is a graph 1700d of the light intensity on the collection planes as a function of collection angle. Light intensity as a function of collection angle for a Lambertian emission is given by curve 1720d. Curve 1712d is the light intensity as a function of collection angle on a corresponding set of planes where the common line of intersection of the planes (i.e., line 230 in FIG. 2b) is aligned along the y-axis. Curve 1714d is the light intensity as a function of collection angle on a corresponding set of planes where the common line of intersection (i.e., line 230 in FIG. 2b) is aligned along the x-axis.

As can be seen from the simulation results, the light intensity corresponding to curve 1714d is greater than the light intensity corresponding to curve 1712d for at least some collection angles between about −20 and 20 degrees, but this range may be modified based on the pattern used within the light-emitting device. It can be seen from the simulated total collection curve 1714c that the total collected emission within collection planes having a common line oriented along the x-axis is greater than the total collected emission of a Lambertian distribution for almost all collection angles, and especially for collection angles greater than about 60 degrees (e.g., greater than 40 degrees, greater than 30 degrees, greater than 20 degrees, greater than 10 degrees).

In contrast, the light intensity corresponding to curve 1712d is similar to the Lambertian distribution 1720d for all collection angles. The orientation of the collection shape for curves 1712c and 1712d corresponds to collection planes having a common line aligned along the y-axis. It can be seen from the simulated curve 1712c that the total collected emission within collection planes having a common line oriented along the y-axis is similar to the total collected emission of a Lambertian distribution for all collection angles. As such, the pattern of FIG. 17a can provide for collimated emission along one axis and non-collimated (e.g., Lambertian) emission along another axis.

Figure 17:
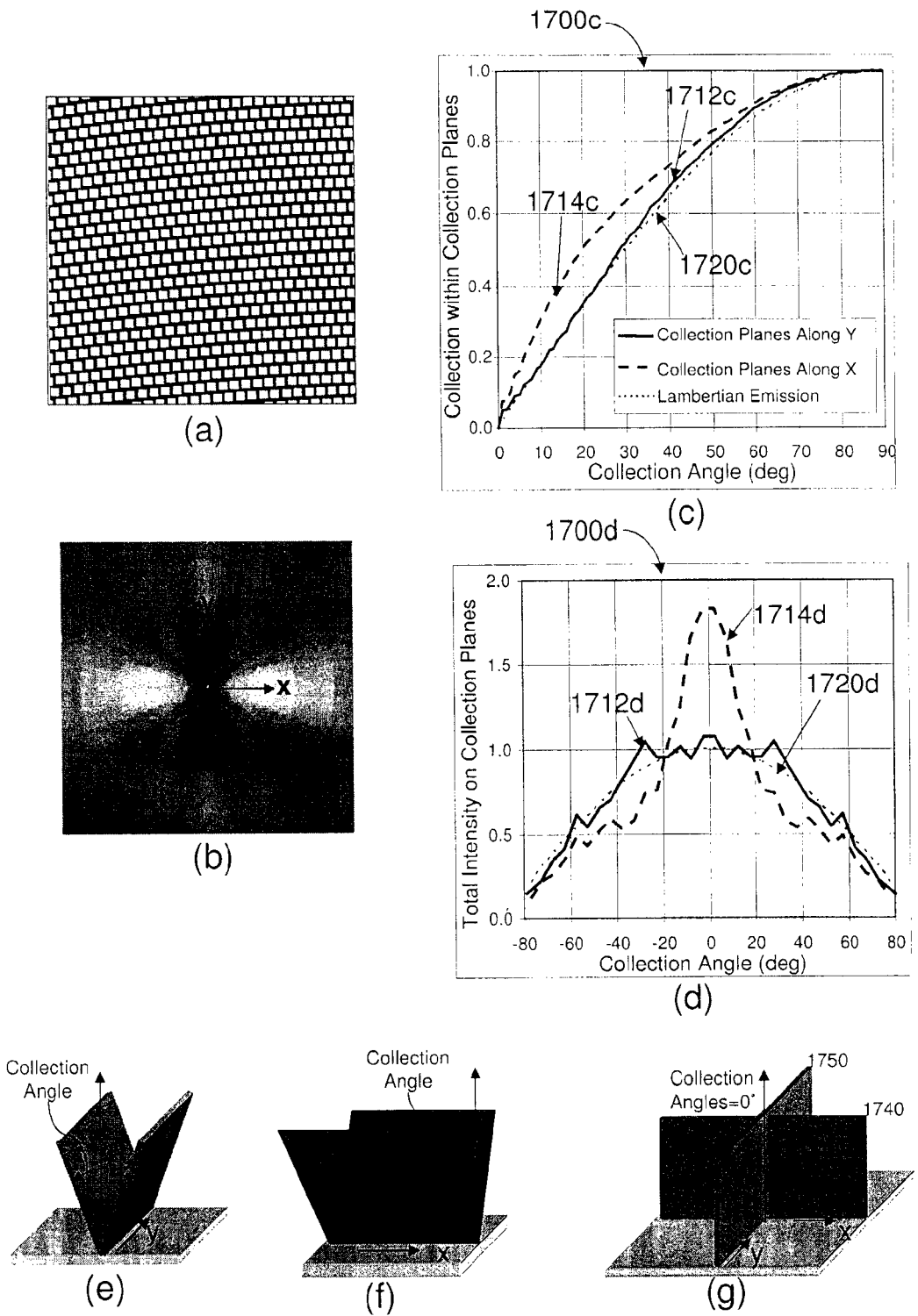
FIG. 17a-d are simulation results from a working example according to some embodiments of the invention.
FIG. 17e-g are collection planes which can be used to characterize anisotropic light emission according to some embodiments of the invention.

In some embodiments presented herein, light emission from a light-emitting device is anisotropic, such that the light intensity on a collection plane along a first axis and which is perpendicular to the emission surface (i.e., 0 degree collection angle) is at least about 20% greater (e.g., at least about 50% greater, at least about 75% greater, at least about 100% greater) than the light intensity on a collection plane along a second axis and which is also perpendicular to the emission surface (i.e., 0 degree collection angle), where the first and second axis are perpendicular. In the working example of FIG. 17, based on the simulation results shown in FIG. 17d, the light intensity on a collection plane along the x-axis and which is perpendicular to the emission surface (i.e., 0 degree collection angle) is about 1.8 times greater than the light intensity along a collection plane containing the y-axis and which is also perpendicular to the emission surface (i.e., 0 degree collection angle). To illustrate the geometry of such collection planes, FIG. 17g shows the collection planes for the 0 degree condition, where a first plane 1740 is aligned along the x-axis, and a second plane 1750 is aligned along the y-axis. It should be appreciated that these collection planes are simply geometrical constructs that may be used to describe the light emission, in particular anisotropic light emission.

Extended Gaps Pattern

Figure 18:
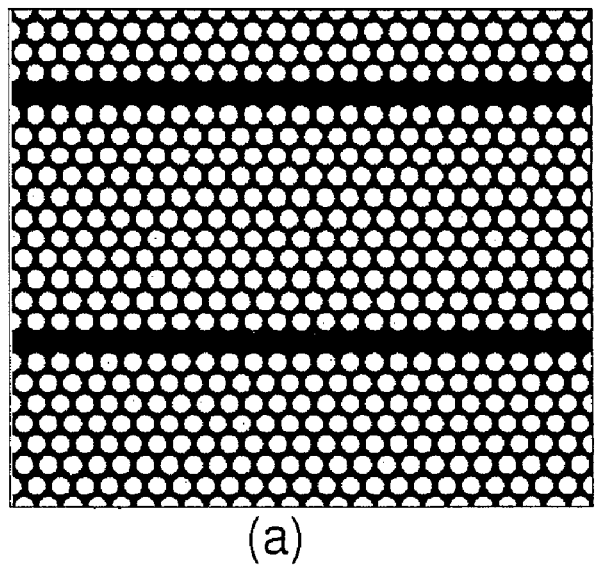
FIG. 18a-b are simulation results from a working example according to some embodiments of the invention.
Figure 18:
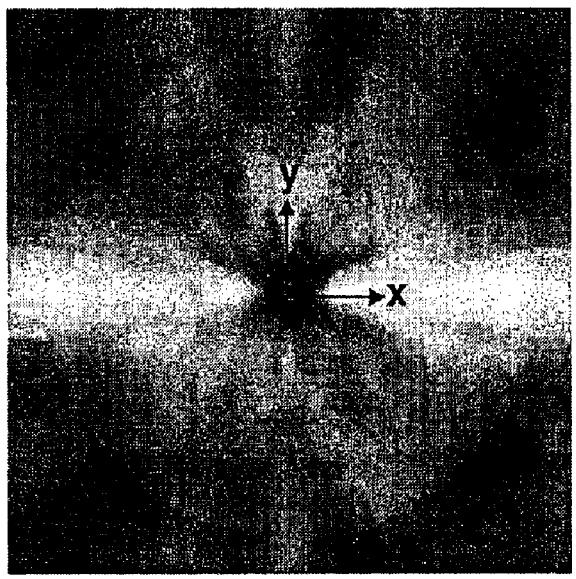

FIG. 18a illustrates a pattern having extended gap regions oriented along one direction. FIG. 18b shows the simulated anisotropic emission resulting from the incorporation of such a pattern into a LED. Such an anisotropic pattern can be characterized using a corresponding set of planes oriented along different directions, such as those illustrated in FIGS. 17e-g, or by using any other suitable method to characterize the anisotropy as the invention is not limited in this respect.

Based on the rotational symmetry of the hexagonal pattern, the simulated emission pattern corresponding to the pattern of FIG. 18a has some inherent asymmetry. By omitting extended sections of the pattern in one direction, a Lambertian component can be added to the emission profile in the selected direction. FIG. 18a shows such a pattern where horizontal lines of a hexagonal pattern have been deleted. The simulated emission pattern in FIG. 18b shows that emission is stronger along the x-axis, as compared to emission along the y-axis, which is similar to the emission illustrated in FIG. 17b. Omitting an increasing number of feature lines of the pattern can further increase the intensity ratio between emission along the x-axis and y-axis, however, total surface emission (i.e., extraction) from the device may decrease as more and more of the surface pattern is deleted. A similar effect may be seen for a pattern where vertical lines of a hexagonal pattern are omitted.

Scaled Patterns

Without wishing to be bound by theory, a collimating surface pattern where the pattern features are compressed in one direction and/or elongated along a second direction can also be used to create an anisotropic emission pattern. Furthermore, any type of pattern can be scaled accordingly to enhance the anisotropic emission pattern. For example, a pattern conforming to a transformation, such as an angular displacement transformation (e.g., of a hexagonal precursor pattern), may be compressed along a first direction and/or elongated along a second direction.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A light-emitting device comprising:
an interface through which emitted light passes therethrough, the interface having a dielectric function that varies spatially according to a pattern, the pattern arranged to provide light emission that has a substantially isotropic emission pattern and is more collimated than a Lambertian distribution of light, wherein the substantially isotropic emission pattern is such that an integrated intensity varies by less than 20% over all azimuthal angles, wherein the integrated intensity is a summed intensity over all polar collection angles.

2. The device of claim 1, wherein the integrated intensity varies by less than 10% over all azimuthal angles.

3. The device of claim 1, wherein a total of the emitted light within a solid angle collection cone is greater than a total emission corresponding to the Lambertian distribution within the solid angle collection cone, wherein the solid angle collection cone has a center axis oriented along a normal of the surface.

4. The device of claim 3, wherein the solid angle collection cone has a collection angle of 30 degrees with respect to the normal of the surface.

5. The device of claim 1, wherein the pattern conforms to a transformation of a precursor pattern according to a mathematical function.

6. The device of claim 5, wherein the precursor pattern comprises a periodic pattern.

7. The device of claim 6, wherein the precursor pattern comprises a hexagonal pattern.

8. The device of claim 5, wherein the precursor pattern comprises a non-periodic pattern.

9. The device of claim 5, wherein the mathematical function comprises providing an angular displacement that at least depends on a radial distance from a reference origin.

10. The device of claim 5, wherein the precursor pattern comprises a plurality of features, and wherein the transformation of a precursor pattern is applied to positions of the plurality of features of the precursor pattern.

11. The device of claim 1, wherein the pattern comprises a plurality of holes formed in the interface.

12. The device of claim 1, wherein the pattern is non-periodic.

13. The device of claim 1, wherein the pattern comprises a first region and a second region, the first region having a dielectric function that varies spatially according to a first pattern, the second region having a dielectric function that varies spatially according to a second pattern, the second pattern being a rotation of the first pattern.

14. The device of claim 13, wherein the first region has an area of greater than 100 microns$^2$.

15. The device of claim 13, wherein the first region has an area of less than 40000 microns$^2$.

16. The device of claim 13, wherein the first pattern is periodic.

17. The device of claim 16, wherein the first pattern comprises a hexagonal pattern.

18. The device of claim 13, wherein the first pattern is non-periodic.

19. The device of claim 13, wherein the first pattern is quasi-crystalline.

* * * * *